(12) United States Patent
Sauber et al.

(10) Patent No.: US 7,693,596 B2
(45) Date of Patent: Apr. 6, 2010

(54) SYSTEM AND METHOD FOR CONFIGURING INFORMATION HANDLING SYSTEM INTEGRATED CIRCUITS

(75) Inventors: William F. Sauber, Georgetown, TX (US); Gary D. Huber, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 563 days.

(21) Appl. No.: 11/302,842

(22) Filed: Dec. 14, 2005

(65) Prior Publication Data

US 2007/0146005 A1    Jun. 28, 2007

(51) Int. Cl.
*G06F 19/00*    (2006.01)

(52) U.S. Cl. .................. 700/121; 326/8; 726/2

(58) Field of Classification Search ........ 726/2–7, 726/31; 719/318; 700/121; 438/131, 132, 438/215, 233, 281, 467; 326/8; 257/208–211, 257/529

See application file for complete search history.

(56) References Cited

U.S. PATENT DOCUMENTS

| | | | |
|---|---|---|---|
| 5,345,413 A | 9/1994 | Fisher et al. | 365/96 |
| 5,659,510 A | 8/1997 | Kwon et al. | 365/200 |
| 5,659,680 A * | 8/1997 | Cunningham et al. | 714/25 |
| 5,663,658 A * | 9/1997 | Cowles et al. | 326/10 |
| 5,787,172 A * | 7/1998 | Arnold | 713/175 |
| 5,889,679 A | 3/1999 | Henry et al. | 364/488 |
| 5,894,571 A * | 4/1999 | O'Connor | 713/2 |
| 5,896,041 A * | 4/1999 | Sher et al. | 326/38 |
| 6,236,901 B1 * | 5/2001 | Goss | 700/95 |
| 6,255,835 B1 | 7/2001 | Oh et al. | 324/763 |
| 6,275,063 B1 | 8/2001 | Mullarkey | 326/38 |
| 6,289,455 B1 * | 9/2001 | Kocher et al. | 713/194 |
| 6,314,337 B1 * | 11/2001 | Marcum | 700/216 |
| 6,324,672 B1 * | 11/2001 | Lawman et al. | 716/1 |
| 6,351,141 B2 | 2/2002 | Mullarkey | 326/38 |
| 6,445,606 B1 * | 9/2002 | Khoury | 365/96 |
| 7,002,829 B2 * | 2/2006 | Singh et al. | 365/96 |
| 7,203,842 B2 * | 4/2007 | Kean | 713/189 |
| 7,231,531 B2 * | 6/2007 | Cupps et al. | 713/322 |
| 7,249,213 B2 * | 7/2007 | Feng et al. | 710/305 |
| 7,266,848 B2 * | 9/2007 | Moyer et al. | 726/29 |
| 2001/0049174 A1 * | 12/2001 | Pitts et al. | 438/381 |

(Continued)

FOREIGN PATENT DOCUMENTS

GB    2 316 180 A    2/1998

(Continued)

*Primary Examiner*—Paul L Rodriguez
*Assistant Examiner*—Carlos Ortiz Rodriguez
(74) *Attorney, Agent, or Firm*—Hamilton & Terrile, LLP; Robert W. Holland (57) ABSTRACT

Processing components to manufacture information handling systems have build-to-order integrated circuits with plural selectively-enabled features set at the information handling system manufacture location. For instance, fuses integrated in the integrated circuits are selectively blown at the information handling system manufacture location to permanently disable features so that the processing components have a desired configuration. As another example, feature enable or disable states are programmed in flash incorporated in the integrated circuit, with the flash programmability subsequently disabled to permanently set the features so that the processing components have a desired configuration. Features are set with keys provided by the processing component manufacturer to track the information handling system manufacturer's use of the features.

19 Claims, 5 Drawing Sheets

U.S. PATENT DOCUMENTS

| | | |
|---|---|---|
| 2002/0150252 A1 | 10/2002 | Wong ........................ 380/277 |
| 2003/0020512 A1 | 1/2003 | Mantey et al. |
| 2004/0218448 A1* | 11/2004 | Osada et al. ................ 365/207 |
| 2005/0154803 A1* | 7/2005 | Huang et al. .................. 710/33 |
| 2005/0165653 A1* | 7/2005 | Meaney et al. ................ 705/26 |
| 2006/0017510 A1* | 1/2006 | Momii et al. ................ 331/1 A |
| 2007/0074046 A1* | 3/2007 | Czajkowski et al. ........ 713/190 |
| 2007/0079387 A1* | 4/2007 | Montecalvo et al. .......... 726/34 |

FOREIGN PATENT DOCUMENTS

| | | |
|---|---|---|
| GB | 2 375 418 A | 11/2002 |
| GB | 2 429 810 A | 5/2007 |
| WO | WO 01/84323 A1 | 11/2001 |
| WO | 02/14323 A3 | 5/2002 |
| WO | WO 02/41323 A3 | 5/2002 |

* cited by examiner

SYSTEM AND METHOD FOR CONFIGURING INFORMATION HANDLING SYSTEM INTEGRATED CIRCUITS

BACKGROUND OF THE INVENTION

1. Field of the Invention

The present invention relates in general to the field of information handling system integrated circuits, and more particularly to a system and method for configuring information handling system integrated circuits.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems are typically built from a plurality of processing components assembled in a housing and interfaced through a main printed circuit board, known as the motherboard, and a number of secondary printed circuit boards, known as daughterboards. A number of the processing components are independent integrated circuits, such as the CPU, while other processing components include integrated circuits to provide intelligence to perform functions, such as microprocessors and microcontrollers in hard disk drives, optical drives, chipsets, network interface cards, bus controllers, graphics cards, memory and displays. Generally, integrated circuits are also known as semiconductor devices because logic functions are performed with circuits fabricated from semiconductor material, such as silicon transistors interfaced with copper wirelines. Typically, the majority of the cost of an integrated circuit arises from the design and fabrication process and not the materials used to make the physical circuits. In other words, the engineering behind the circuit designs and the capital equipment used to build the circuit designs represent the greater portion of the expense of an integrated circuit. For this reason, manufacturers often combine a number of features in a given integrated circuit, even if all of the features are not used or even desired by all end users. Manufacturing costs are reduced for such multi-function integrated circuits since fewer circuit designs and manufacture process designs are needed for producing fewer types of integrated circuits.

One difficulty with the manufacture and sale of multi-function integrated circuits is that purchasers will balk at paying for functions that are not wanted for a particular information handling system. For instance, RAID functionality in a chipset is generally not needed for basic desktop systems but sometimes included as a function so that the same chipset is used in basic and advanced systems. However, integrated circuit manufacturers generally have to charge for all included functions, otherwise a purchaser may order and pay for limited numbers of functions while using additional functions without the knowledge of the integrated circuit manufacturer. To solve this difficulty, single integrated circuit device types are selectively differentiated by disabling or restricting features of speeds based on pricing or the market segment purchasing the device. Differentiation of a single device type is typically accomplished by activating fusing options during the manufacture process. For instance, blowing a fuse built into an integrated circuit has the effect of making the portion of the circuit associated with the fuse inaccessible. Reducing functions by blowing fuses during manufacture also has the advantage of reducing test costs since disabled functions need not be tested. However, differentiating integrated circuits with fusing results in system integrators having to define multiple types of printed circuit boards to accommodate various fusing options, resulting in platform fragmentation and increased end user costs.

SUMMARY OF THE INVENTION

Therefore a need has arisen for a system and method which allows integrated circuit system integrators flexibility to configure fully featured integrated circuits through the selection of desired features.

In accordance with the present invention, a system and method are provided which substantially reduce the disadvantages and problems associated with previous methods and systems for configuring features of an information handling system processing component integrated circuit. Feature sets are selectively enabled at manufacture of an information handling system to build processing components to order as information handling systems are built to order. Processing components are configured to have feature sets associated with an information handling system configuration by selectively enabling or disabling features of integrated circuits in the processing components. The permanent setting of integrated circuit features is performed at the information handling system manufacture location for improved flexibility in the information handling system manufacture process.

More specifically, processing components are shipped to an information handling system manufacture location with integrated circuits having a predetermined feature set and an incorporated feature selector. For instance, in one embodiment integrated circuit feature sets are shipped fully enabled with fuses that are selectively blown at the information handling system manufacture location to disable associated features. Alternatively, integrated circuit feature sets are shipped at least partly disabled with a feature set table incorporated in the integrated circuit that allows feature states to change between off and on. A configuration engine determines a feature set appropriate for an information handling system configuration so that a feature set utility interacts with the feature selector to permanently set the features in the integrated circuit to support the information handling system configuration. A key interface provides a key to the feature set utility to authorize the desired feature set and allow tracking by the processing component manufacture of features used by the information handling system manufacturer. For instance, keys are downloaded from a key server associated with the processing component manufacturer and destroyed after use by the feature set utility.

The present invention provides a number of important technical advantages. One example of an important technical advantage is that processing component integrated circuits shipped to an information handling system manufacturer have selectively enabled features that allow the processing components to be built to order for information handling system configurations. Keys secure access to a feature selector of an integrated circuit to prevent authorized use of features and aid tracking of enabled features. As an example, a CPU has a floating point assist feature selectively enabled or disabled to meet an information handling system configuration. As other examples, a CPU has a dual core selectively enabled or disabled, a chipset has memory and I/O hub integrated circuit features selected, the storage capacity and access speed of RAM is selected by selection of features, and a display's ability to provide television functions is selectively enabled through features of its microcontroller. Manufacture costs are reduced by having "built-to-order silicon" within processing components that are enabled or disabled by the information handling system manufacturer. Processing component manufacturers protect intellectual property values of features while using fewer design and manufacture processes. Information handling system manufacturers gain increased flexibility in the use of parts in the information handling system manufacture process.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Build-to-order manufacture of information handling system processing component integrated circuits provides flexibility to configure feature sets of the integrated circuit at assembly of the processing components into an information handling system. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
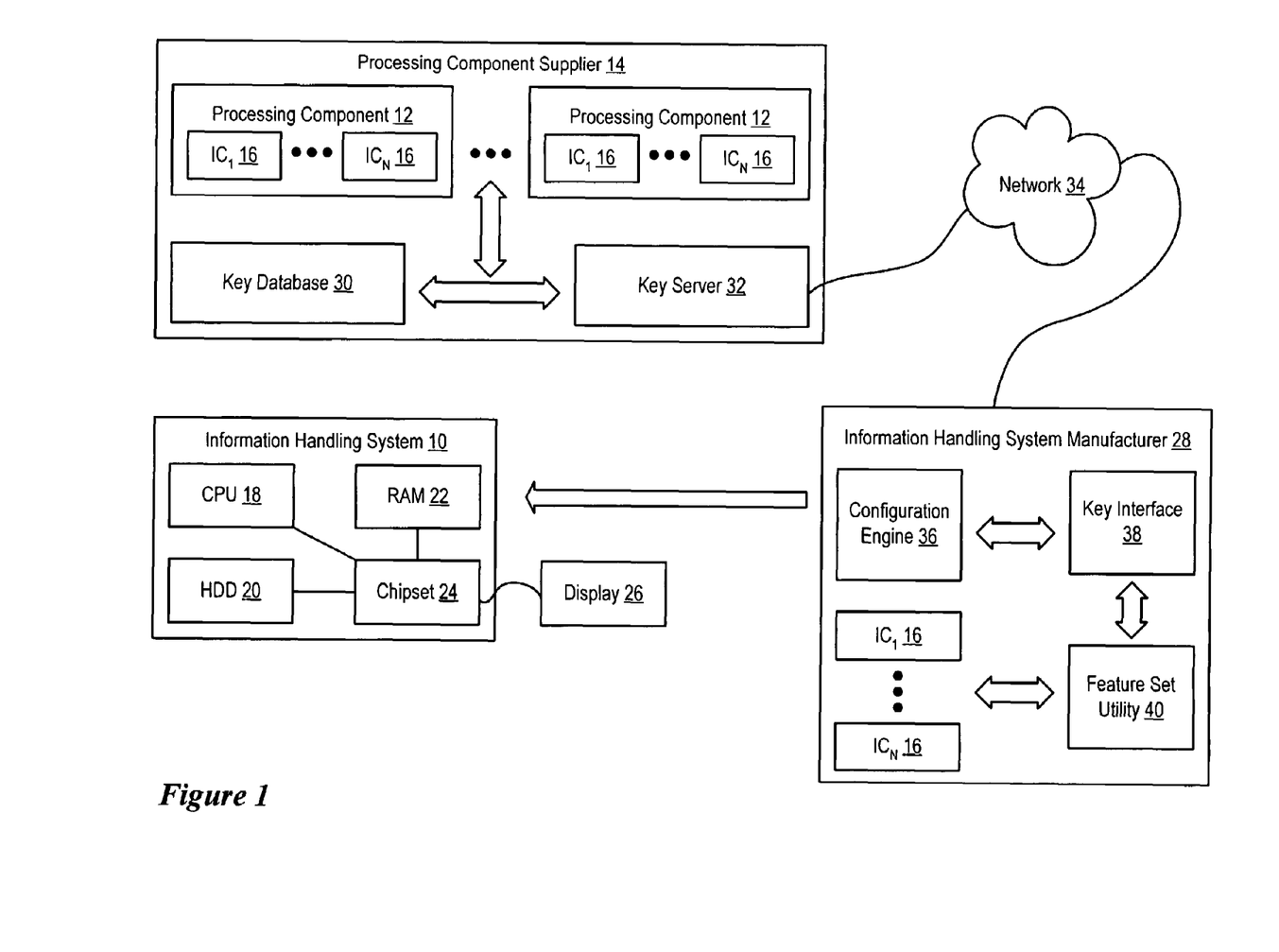
FIG. 1 depicts a block diagram of a system for setting information handling system processing component integrated circuit features according to an information handling system configuration.

Referring now to FIG. 1, a block diagram depicts a system for setting information handling system processing component integrated circuit features according to an information handling system configuration. Information handling systems 10 are built from processing components 12 provided from a processing component supplier location 14. Processing components 12 include one integrated circuit 16, such as processor, or plural integrated circuits 16, such as a core logic chip set, with each integrated circuit having plural features that perform functions of each processing component. For instance, processing components include CPUs 18, hard disk drives 20, RAM 22, chipsets 24 and a display 26 or other peripheral like a printer. Each processing component has one or more integrated circuits, each with structures that perform a variety of functions. As examples, CPU 18 processes information with a variety of features, such as multiple cores or floating point assist circuitry, RAM 22 stores predetermined amounts of information in defined address ranges with defined access speeds as limited by chipset 24, chipset 24 having integrated circuits to provide a memory hub, I/O hub, graphics and networking, and display 26 which interfaces through a variety of input signals, such as DVI, VGA, and television inputs. Integrated circuits 16 are fabricated to provide multiple functions for each processing component and to include a feature selector that allows a feature set on a given integrated circuit to be selectively enabled or disabled on a permanent basis. For instance, fuses incorporated in the integrated circuit are blown to make features associated with each fuse inaccessible. Alternatively, flash memory incorporated in each integrated circuit defines on or off states for features of the integrated circuit that are permanently set by ending the programmability of the flash memory.

Processing components 12 are built at processing component supplier 14 with integrated circuits 16 having features set to a predetermined state. Where integrated circuits 16 use fuses to selectively disable features off, integrated circuits 16 typically have all features enabled upon shipment of processing component 12 to an information handling system manufacture location 28. Where integrated circuits 16 use incorporated flash memory to set features, features may be all enabled, all disabled or part enabled and disabled. A key associated with alterations to the feature set is stored in key database 30 and made available through a key server 32 interfaced with a network 34, such as the Internet. Processing component 12 is shipped from processing component supplier location 14 to information handling system manufacturer location 28 with the integrated circuit feature sets in the predetermined states. The information handling system manufacturer is provided access to key database 30 to set the selectively enabled feature as desired once the processing components are available for assembly at location 28. Keys of key database 30 prevent unauthorized changes to an integrated circuit feature set and allow tracking of feature sets enabled by an information handling system manufacturer. For instance, keys of key database 30 are purchased separate from processing components 12 and applied as desired by the information handling system manufacturer to configure processing component integrated circuit feature sets. In one embodiment, a one-use key and a master key are both required for changing integrated circuit feature sets. Keys may secure feature sets by a pattern match or with greater levels of secure verification logic built into the integrated circuits. Each key may relate to a single feature or, alternatively, some keys may relate to multiple features tied to a SKU, such as features for multiple integrated circuits within a processing component, like the memory and I/O hub of chipset 24. In alternative embodiments, information handling system manufacture location 28 is geographically distributed, such as by manufacture of subcomponents at various locations shipped to a final assembly location. In one alternative embodiment, key server 32 and database 30 are maintained at information handling system manufacturer location 28 with billing information forwarded to processing component supplier location 14.

Processing components 12 are assembled into information handling systems 10 at information handling system manufacture location 28 according to configurations provided by a configuration engine 36, such as in build-to-order configurations. Configuration engine 36 compares the predetermined state of features of integrated circuits 16 loaded in processing components 12 with manufacture configurations to determined the integrated circuits 16 needing changes to their feature sets. For instance, an information handling system configuration calling for a CPU without floating point assist will generate a request from configuration engine 36 to a key interface 38 for a key to disable the floating point assist of a CPU shipped with that feature. Key interface 38 retrieves the key from key server 32 through network 34 and provides the key to a feature set utility 40. Feature set utility 40 applies the key to access the feature selector of the CPU and disable the floating point assist, such as by blowing a fuse associated with the floating point assist, and then destroys the key. Feature set utility 40 reports key usage through key interface 38 to key server 32 to track the feature sets used by integrated circuits 16 assembled into information handling systems 10. Feature set utility 40 applies keys in a number of ways, such as by manual input of an operator, file downloads, a USB flash device, a single key on a flash device plugged into an LPC header, or through other devices interfaces, such as a JTAG port. All or part of the key verification utility may be executed in the integrated circuit itself.

Figure 2:
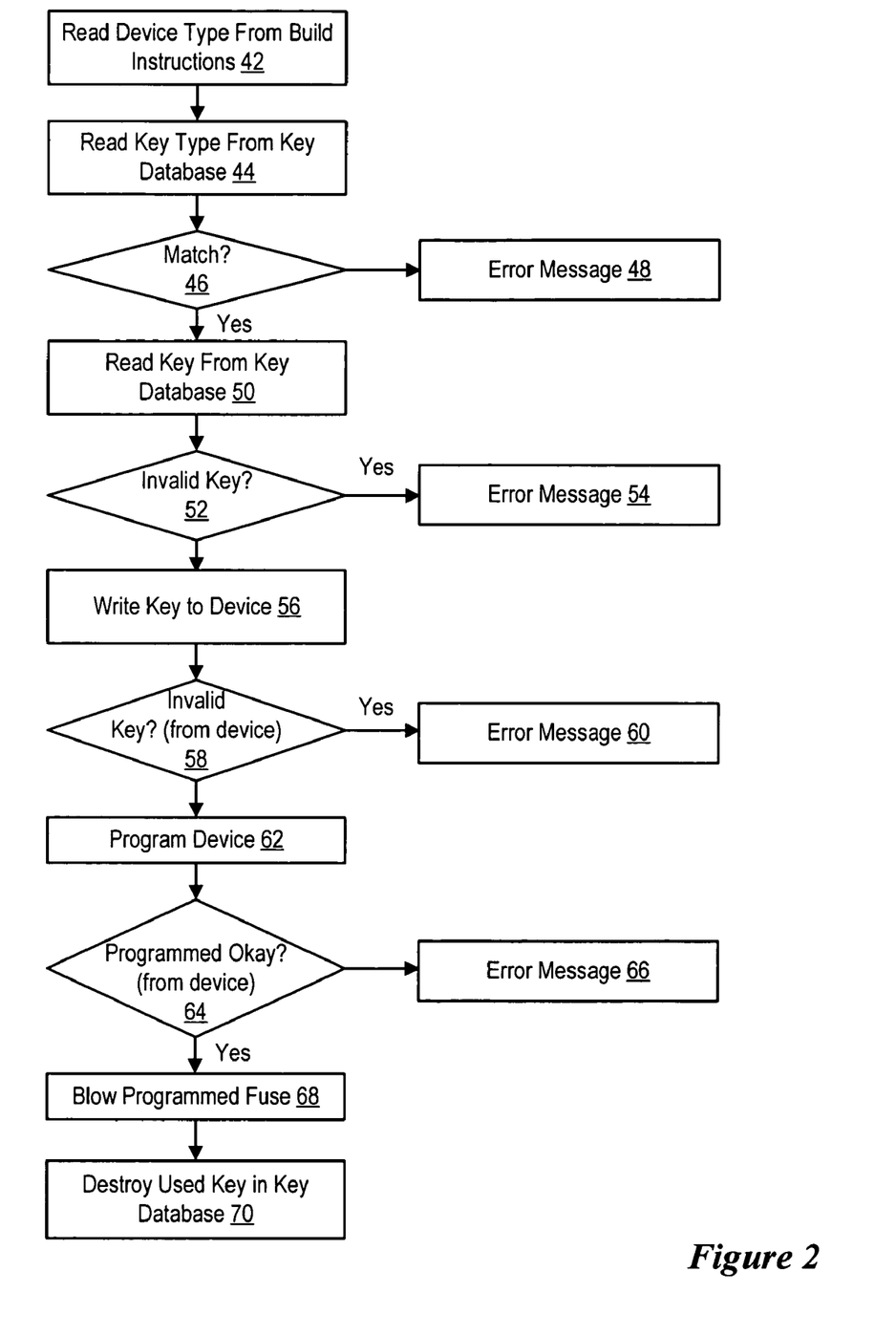
FIG. 2 depicts a flow diagram of a process for setting integrated circuit features according to an information handling system configuration.

Referring now to FIG. 2, a flow diagram depicts a process for setting integrated circuit features according to an information handling system configuration. The process begins at step 42 with a read of the device type from build instructions associated with the configuration of the information handling system and proceeds to step 44 for a read of the key type from the key database. At step 46, the key and device types are compared to ensure a match, otherwise an error message is provided at step 48. At step 50, the key is read from the key database to initiate setting of features for the device. At step 52, the key is checked for validity with an invalid key presenting an error message at step 54. If the key is valid, it is written at step 56 to the device to allow changes to the feature set of the device by enabling or disabling selectively enabled features. At step 58, the device is queried to ensure that the key is accepted by the device as a valid key with an invalid key presenting an error message at step 60. If the device accepts the key as valid, the process continues to step 62 for programming of the device, such as by preparing the blowing of fuses or the altering of enabled or disabled states for features in flash memory of the device. At step 64, the device is queried to ensure proper programming with incorrect setting of features presenting an error message at step 66. If feature set programming is properly done, then at step 68 the programmed features are set, such as by blowing appropriate device fuses or updating device flash memory feature set tables. At step 70, the key used to program and set the features is destroyed to ensure accurate tracking of selected features.

Figure 3:
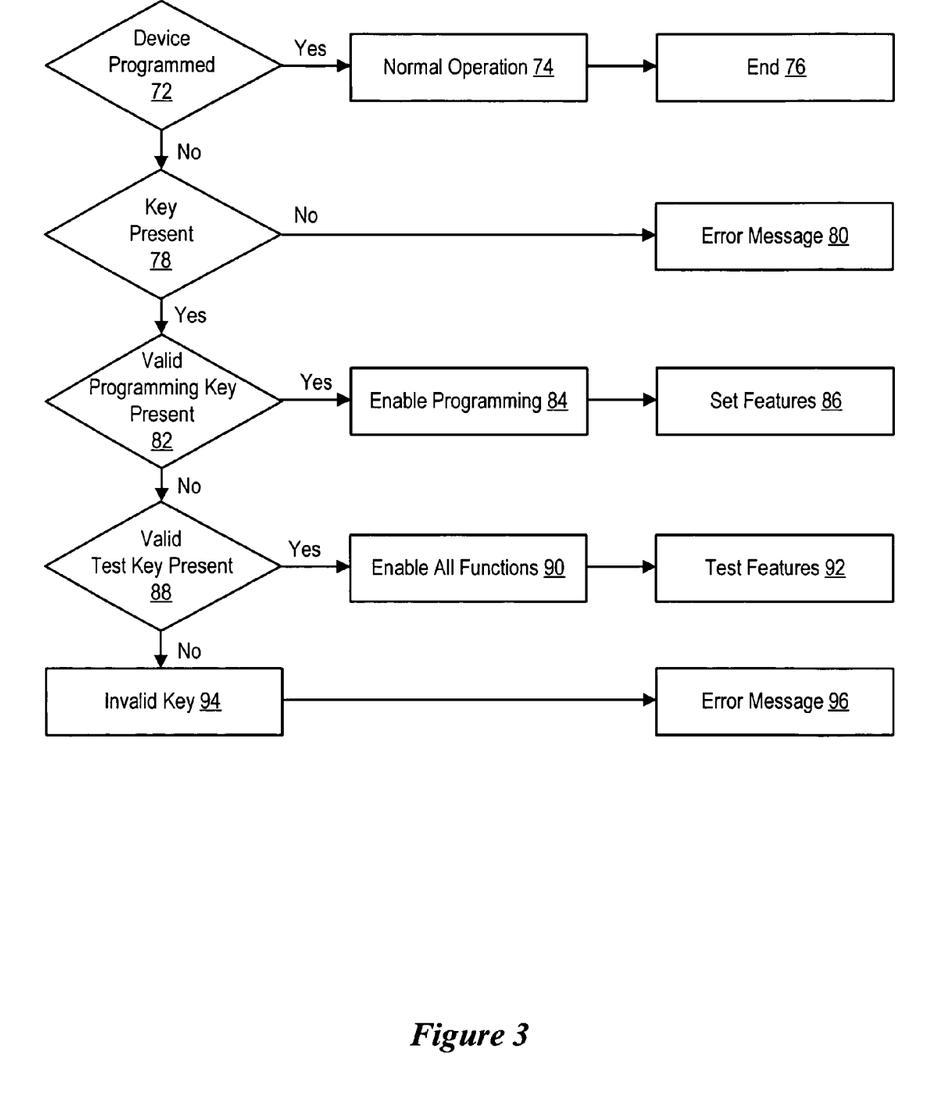
FIG. 3 depicts a flow diagram of integrated circuit logic for setting features in response to external inputs.

Referring now to FIG. 3, a flow diagram depicts integrated circuit operations. The process begins at step 72 with a determination of whether the device is programmed and, if so, at step 74 normal device operations are allowed with the process ending at step 76. If at step 72 the device is not programmed, the process continues to step 78 to check if a key is present with the lack of a key presenting an error message at step 80. If at step 78 a key is present, the process continues to step 82 to determine if the key is valid programming key. If a valid programming is present, the process continues to step 84 to enable programming and concludes at step 86 once features are set. If at step 82 a determination is made that the key is not a valid programming key, the process continues to step 88 to determine if the key is a valid test key. If a valid test key is present, the process continues to step 90 to enable all functions for testing and to step 92 to test features. If at step 88 the key is not a valid test key, the process continues to step 94 to determine that the key is invalid and issue an error message at step 96. Note that the scope of the test key depends in part on the predetermined states of the features at delivery of the processing components. Processing components sent with all features enabled may be tested before shipment, however, processing components shipped with disabled features will have to test those features subsequently enabled.

Figure 4:
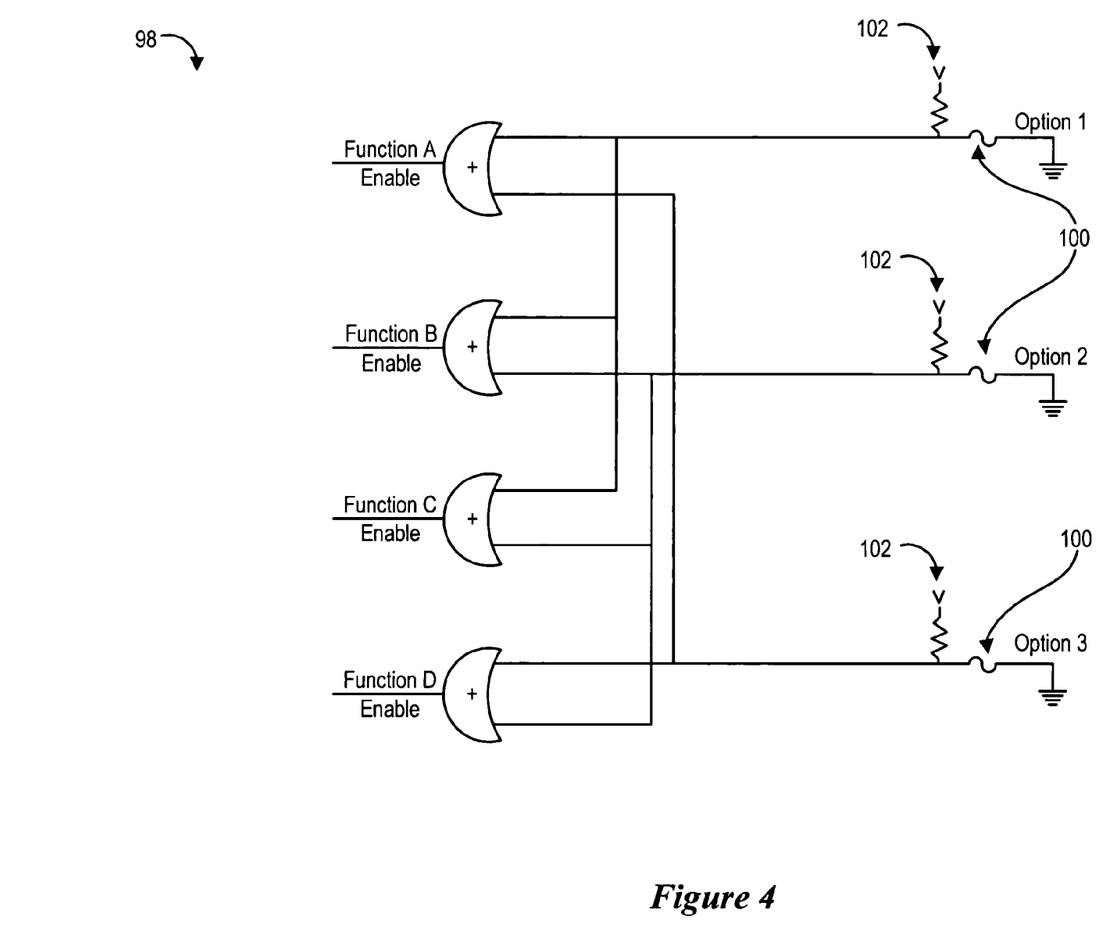
FIG. 4 depicts a circuit diagram of an integrated circuit fuse arrangement.
Figure 5:
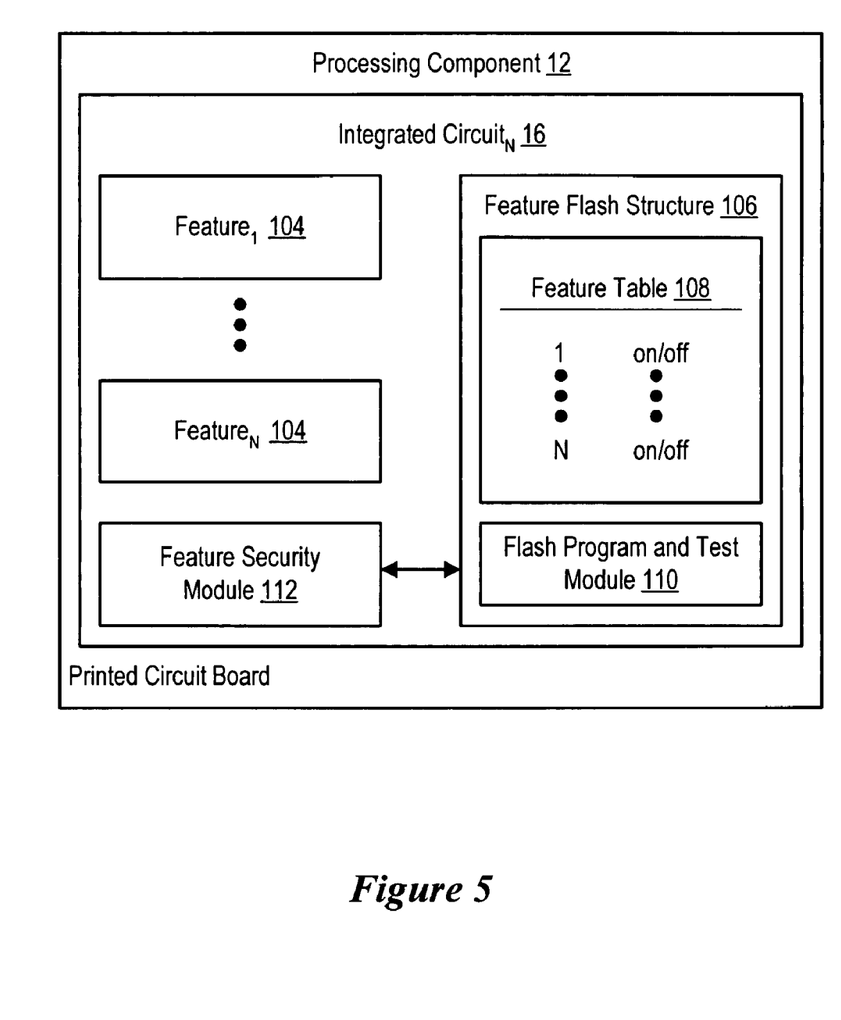
FIG. 5 depicts a processing component having an integrated circuit with selectively-enabled features set through integrated flash memory.

Referring now to FIG. 4, a circuit diagram depicts an integrated circuit fuse arrangement 98 that provides a single fuse 100 per feature set combination. Functions A through D are selectively enabled depending upon the fuse 100 blown by feature set voltage 102. Blowing a fuse 100 disconnects functions associated with the fuse from other functions of the integrated circuit. In contrast, referring now to FIG. 5, a processing component 12 is depicted having an integrated circuit 16 with selectively-enabled features 104 set through integrated flash memory structure. A feature table 108 defines the state of each feature 104 and is programmable by a flash program and test module 110. The programmability of feature table 108 by module 110 is managed by a feature security module 112, which requires an appropriate key. Once the states of the features are programmed in feature table 108, feature security module 112 permanently disables the flash program and test module 110 to fix the feature set according to what was authorized by the key, such as by setting a programmed bit in the flash. During normal operation, the feature bits would be transferred from flash to a register which enables or disables device features. Integration of feature table 108 within integrated circuit 16 provides security for feature settings and added flexibility to the processing component manufacturer for the initial states of the features on shipment of the processing component.

Although the present invention has been described in detail, it should be understood that various changes, substitutions and alterations can be made hereto without departing from the spirit and scope of the invention as defined by the appended claims.

What is claimed is:

1. A method for building information handling systems from plural processing components, the method comprising:
   sending the processing components from an integrated circuit manufacturer to an information handling system manufacturer;
   receiving the processing components at an information handling system manufacture location, at least one processing component having at least one integrated circuit, the integrated circuit having plural features;

receiving an information handling system configuration having the processing component with at least some of the plural features selected and some of the plural features deselected;

modifying the integrated circuit to permanently enable the selected features and permanently disable the deselected features;

building the information handling system to include the processing component; and providing information on the enabled or disabled features to the integrated circuit manufacturer.

2. The method of claim 1 further comprising:

receiving a key at the information handling system manufacture location, the key having authorization to modify the integrated circuit with the selected and deselected features;

applying the key to allow the modifying of the integrated circuit; and tracking the applying of the key to track selected and deselected features.

3. The method of claim 1 wherein modifying the integrated circuit further comprises blowing fuses incorporated in the integrated circuit that are associated with disabling the deselected features.

4. The method of claim 1 wherein the processing component comprises a chipset having plural integrated circuits, the method further comprising:

receiving an information handling system configuration having the chipset with at least some of the plural features of each of the plural integrated circuits selected and some deselected; and modifying the integrated circuits to permanently enable the selected features and permanently disable the deselected features.

5. The method of claim 1 wherein:

receiving the processing components further comprises the at least one processing component with plural of the features disabled; and modifying the integrated circuit further comprises:

altering a feature table integrated in flash memory of the integrated circuit to enable selected features; and permanently restricting access to the feature table.

6. The method of claim 5 wherein modifying further comprises entering a key to access the feature table.

7. The method of claim 1 wherein the processing component comprises a CPU and the plural features comprise a floating point assist.

8. The method of claim 1 wherein the processing component comprises a memory and the plural features comprise variable memory capacity.

9. An information handling system processing component comprising:

at least one integrated circuit having plural selectively-enabled features;

a feature selector incorporated in the integrated circuit and operable to permanently enable or disable selected of the plural selectively-enabled features; and a key associated with access to the feature selector and operable to allow the permanent enabling and disabling of each of the plural selectively-enabled features;

wherein the feature selector comprises:

flash memory storing an enabled or disabled status for each of the plural selectively-enabled features, the flash memory programmable to chance the status of the features; and a feature security module operable to permanently disable the flash memory programmability.

10. The information handling system processing component of claim 9 wherein the key comprises a pattern stored on the integrated circuit, the feature selector accessible if a pattern input to the integrated circuit matches the pattern stored on the integrated circuit.

11. The information handling system processing component of claim 9 wherein the integrated circuit comprises a dual core processor and the features comprise having one active core and having two active cores.

12. The information handling system processing component of claim 9 wherein the integrated circuit comprises a display controller.

13. A system for building information handling systems at an information handling system manufacture location from plural processing components received from a processing component supplier location, the system comprising:

a configuration engine at the information handling system manufacture location operable to determine information handling system configurations from plural processing components, at least one of the processing components having an integrated circuit, the integrated circuit having plural selectively-enabled features, the information handling system configurations having the selectively-enabled features enabled or disabled;

a feature set utility at the information handling system manufacture location interfaced with the configuration engine and operable to permanently enable or disable the selectively enabled features of the processing components according to the configurations; and a key interface associated with the feature set utility and operable to apply a key to allow the feature set utility to permanently enable or disable features of integrated circuits to provide processing components determined by the configuration engine.

14. The system of claim 13 further comprising a key server at the processing component supplier location operable to provide keys to the key interface and to track features enabled on the integrated circuits by the keys.

15. The system of claim 13 wherein the key comprises a code input to a low pin count header of the integrated circuit.

16. The system of claim 13 wherein the key comprises a code, the key interface having plural copies of the code and further operable to destroy each copy after each copy allows operation of the feature set utility.

17. The system of claim 13 wherein the selectively-enabled features of the processing components initially have a disabled state, the feature set utility enabling features included in a configuration.

18. The system of claim 13 wherein the selectively-enabled features of the processing components initially have an enabled state, the feature set utility disabling features not included in a configuration.

19. An information handling system processing component comprising:

at least one integrated circuit having plural selectively-enabled features;

a feature selector incorporated in the integrated circuit and operable to permanently enable or disable selected of the plural selectively-enabled features; and a key associated with access to the feature selector and operable to allow the permanent enabling and disabling of each of the plural selectively-enabled features;

wherein the feature selector comprises a fuse associated with each of the plural selectively-enabled features, the fuse operable to activate to permanently prevent access to an associated selectively-enabled feature.

* * * * *